March 25, 1969 J. R. WHITTEN 3,435,374

NEGATIVE RESISTANCE DEVICE OSCILLATOR CIRCUITS HAVING HARMONIC IMPEDANCE MEANS FOR MODIFYING THE OSCILLATOR FREQUENCY

Filed Aug. 31, 1967

Inventor:
James R. Whitten,
by Louis A. Moncha

United States Patent Office 3,435,374
Patented Mar. 25, 1969

3,435,374

NEGATIVE RESISTANCE DEVICE OSCILLATOR CIRCUITS HAVING HARMONIC IMPEDANCE MEANS FOR MODIFYING THE OSCILLATOR FREQUENCY

James R. Whitten, Scotia, N.Y., assignor to General Electric Company, a corporation of New York Filed Aug. 31, 1967, Ser. No. 664,749
Int. Cl. H03b 7/14, 11/10, 19/14
U.S. Cl. 331—107 13 Claims

ABSTRACT OF THE DISCLOSURE

A family of oscillator circuits each includes an active negative resistance device and at least one additional resonant network tuned to a particular harmonic of the oscillator fundamental frequency for modifying the fundamental frequency output of the oscillator. The additional resonant networks are connected in direct circuit relationship with the negative resistance device for either increasing or decreasing the frequency deviation of the oscillator with changes in the bias voltage of the negative resistance device. The direction of the frequency deviation is determined by the particular interconnection of the additional resonant networks and their types, series, or parallel resonant. The frequency of the oscillator may also be controlled, without bias voltage change, by constructing the additional resonant networks from adjustable impedance elements.

My invention relates to oscillator circuits utilizing an active negative resistance device, and in particular, to the use of harmonic impedance means including series and parallel resonant networks for modifying the frequency of the oscillator output.

Oscillator circuits employing active negative resistance devices such as a tunnel diode or vacuum tube or transistor devices employing feedback are well known in the art. Such oscillator circuits are employed in numerous electronic circuits for generating electrical signals having a desired frequency or for obtaining frequency modulation. Particular characteristics of active negative resistance devices such as a tunnel diode are highly nonlinear and this is especially true of the A.C. (incremental) conductance which varies from positive values through a negative conductance region and thence again to a positive region with increasing forward bias voltage. As an element of an oscillator circuit, the negative resistance diode in operation traverses both the positive and negative conductance regions and such nonlinear operation produces harmonic frequency currents at various phase angles with respect to the fundamental frequency current. The harmonic frequency currents produce harmonic frequency voltages which heterodyne (mix) with each other and the fundamental in the diode to produce a reconstituted fundamental frequency current out of phase with the original fundamental frequency current. As a result, the oscillator output must change in frequency slightly to cancel the effect of the phase angle and thereby obtain stable operation. Since the nonlinearity and resulting harmonic frequency currents which contribute to the phase angle and resultant frequency deviation are a function of the diode bias voltage, the frequency deviation is also a function of the bias voltage. Thus, there is a need for modifying the magnitude and phase of the harmonic currents to thereby modify the fundamental frequency of the oscillator circuit in a desired manner which may be either (1) to render the oscillator fundamental frequency output insensitive to bias voltage change to thereby produce a more stable oscillator or (2) to increase the deviation of oscillator fundamental frequency with bias voltage change to thereby provide a convenient means for achieving frequency modulation by means of bias voltage control.

Therefore, one of the principal objects of my invention is to provide an oscillator utilizing an active device having a negative resistance characteristic with harmonic impedance means for modifying the fundamental frequency output of the oscillator.

Another object of my invention is to construct the harmonic impedance means from one or more series resonant networks tuned to successive low harmonics of the oscillator fundamental frequency to render the oscillator either more or less frequency sensitive to bias voltage changes, depending upon the particular interconnection thereof in the oscillator circuit.

Another object of my invention is to construct the harmonic impedance means from parallel resonant networks tuned to successive low harmonics of the oscillator fundamental frequency to render the oscillator more sensitive to bias voltage changes and thereby increase the degree of frequency modulation achieved by bias voltage control.

A still further object of my invention is to construct the harmonic impedance means from adjustable impedance elements to thereby control the oscillator frequency without bias voltage control.

Briefly stated, my invention provides an oscillator circuit utilizing an active device having a negative resistance characteristic and harmonic impedance means connected in direct circuit relationship with the negative resistance device for modifying the fundamental frequency output of the oscillator. The harmonic impedance means may comprise series resonant or parallel resonant circuits having at least one end thereof connected directly to a terminal of the negative resistance device. The frequency deviation is increased for changes of the bias voltage supplied to the negative resistance device by connecting one or more parallel resonant circuits, tuned to successive low harmonics of the fundamental frequency, across the negative resistance device. The increased frequency deviation is also obtained in a second embodiment of the invention wherein a series resonant circuit tuned to the fundamental oscillator frequency is connected in series circuit relationship between one terminal of the negative resistance device and the conventional portion of the oscillator circuit determining the oscillator fundamental frequency. A decrease in frequency deviation, that is, greater frequency stability, is obtained in a third embodiment having one or more series resonant circuits tuned to successive low harmonics of the oscillator fundamental frequency and connected directly across the negative resistance device. In each of the embodiments the harmonic impedance means modify the magnitude and phase of harmonic frequency currents generated by the nonlinear characteristics of the negative resistance device to thereby increase the effect of the nonlinearity in the first two embodiments, and decrease the effect in the third embodiment. The frequency of the oscillator may also be controlled, without bias voltage control, by constructing the harmonic impedance means from adjustable impedance elements.

The features of my invention which I desire to protect herein are pointed out with particularity in the appended claims. The invention itself, however, both as to its organization and method of operation, together with further objects and advantages thereof, may best be understood by reference to the following description taken in connection with the accompanying drawing wherein like parts in each of the several figures are identified by the same character reference and wherein:

Figure 1:
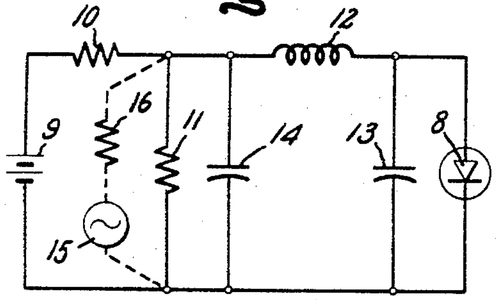
Fig. 1. PRIOR ART
FIGURE 1 is a schematic diagram of a conventional negative resistance diode oscillator.

Referring now in particular to FIGURE 1, there is shown a conventional L-C negative resistance diode oscillator in its most simplified circuit configuration. The negative resistance diode is an active device exhibiting both positive and negative resistance characteristics as exemplified in FIGURE 2 which illustrates the variation of the diode alternating current (incremental) conductance $g$ with forward direct current (D.C.) bias voltage V impressed across the diode. The negative resistance diode which may be a tunnel diode, or any other active device which exhibits both positive and negative resistance operating regions, is normally biased for steady state operation at or near the point of maximum negative conductance. In FIGURE 1, negative resistance diode 8 is biased to its desired operating point by means of a suitable direct current voltage supply 9 and voltage dividing resistors 10 and 11. Inductor 12 and capacitor 13 are the primary elements for determining the fundamental frequency of the oscillator circuit illustrated in FIGURE 1. The oscillator may be coupled to a suitable load by inductive coupling through inductor 12 and this loading effect has been found to have a negligible effect on the oscillator frequency deviation with change in bias voltage. Frequency modulation of the oscillator output is conventionally achieved by superimposing a small amplitude alternating current (A.C.) voltage on the D.C. bias. The superimposed A.C. voltage is indicated by a dashed line connection of an A.C. voltage source 15 and resistor 16 across resistor 11. The bias means 9, 10, 11 for diode 8 is effectively shunted for A.C. signals by means of bypass capacitor 14 which has a significantly larger value of capacitance than capacitor 13 to thereby provide a very low impedance path for the A.C. signals generated in the circuit comprising biased diode 8, inductor 12, and capacitor 13. The oscillator circuit oscillates at a fundamental resonant frequency $w_0^2=1/LC$ and the oscillations have a stabilized amplitude when the net losses equal zero (the negative resistance of the diode cancels the positive resistance in the oscillator circuit).

Figure 2:
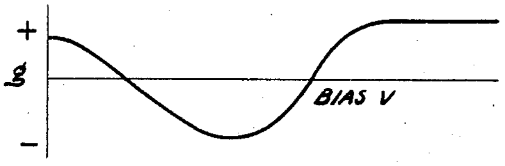
FIGURE 2 is a plot of the conductance-bias voltage characteristic of a negative resistance diode of the type shown in FIGURE 1.

The nonlinear conductance characteristics of the negative resistance diode as illustrated in FIGURE 2 causes the oscillator fundamental frequency to also be a function of the diode bias voltage for the reasons stated above, although it is appreciated that the primary frequency determining elements are inductor 12 and capacitor 13. Thus, the fundamental frequency and frequency deviation of the oscillator output is determined by (1) the maximum negative conductance of the negative resistance diode, (2) the inductance and capacitance values of the tuned circuit elements 12, 13, and (3) the D.C. bias of the negative resistance diode.

Figure 3:
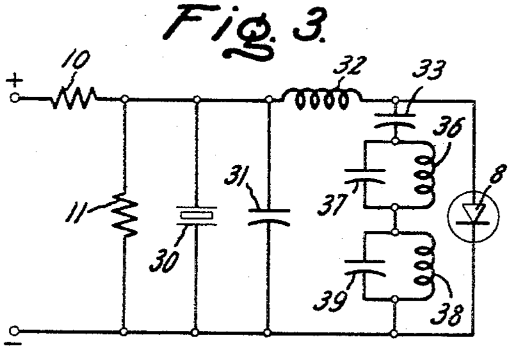
FIGURE 3 is a first embodiment of a crystal controlled oscillator utilizing the negative resistance diode and harmonic impedance means in accordance with my invention.

The previous discussion serves as background for my invention which comprises providing one or more additional frequency resonant networks tuned to particular low harmonic frequencies of the oscillator fundamental frequency for the purpose of modifying the fundamental frequency output of the oscillator. Referring now in particular to FIGURE 3, there is illustrated a first embodiment of a crystal controlled oscillator constructed in accordance with my invention. A piezoelectric crystal 30 having a series resonance mode at the oscillator desired fundamental frequency is connected directly in parallel with resistor 11 of the bias voltage means (D.C. source 9 not shown) for the active negative resistance diode device 8. An impedance transforming pi network comprising capacitor 31, inductor 32, and capacitor 33 interconnects crystal 30 and negative resistance diode 8 and matches the low impedance of the crystal to the high impedance of the diode. A connection of capacitor 33 directly across diode 8 would comprise a conventional crystal controlled oscillator in the same manner that FIGURE 1 illustrates a conventional L-C oscillator circuit. My invention comprises the addition in series with capacitor 33 of one or more parallel resonant networks tuned to successive low harmonics of the oscillator fundamental frequency. Two parallel resonant networks are illustrated in FIGURE 3 connected in series circuit relationship with capacitor 33, the entire circuit connected directly across negative resistance diode 8. In particular, a first parallel resonant network comprising inductor 36 and capacitor 37 is resonant at the second harmonic of the oscillator fundamental frequency and a second parallel resonant circuit comprising inductor 38 and capacitor 39 is resonant at the third harmonic of the fundamental frequency. It is to be understood that additional parallel resonant circuits may be connected in series circuit relationship with capacitor 33 and the first two parallel resonant circuits and they would be tuned to the next higher successive harmonics of the oscillator fundamental frequency. A necessary condition imposed on my FIGURE 3 harmonic impedance means is that at the oscillator fundamental frequency the combined impedance of elements 36–39 be less than (and preferably much less than) the impedance of capacitor 33, whereas at the harmonic frequencies such impedance is greater than (and preferably both such impedance and the diode impedance are much greater than) the impedance of such capacitor. The operation of my oscillator may be described as follows. In the absence of the harmonic impedance means 36–39, the harmonic frequency currents generated by the non-linearity of diode 8 are substantially short circuited through the low impedance (at harmonic frequencies) of capacitor 33. The addition of the parallel resonant harmonic impedance means causes the harmonic frequency currents to produce harmonic frequency voltages across diode 8 of greater magnitude than in the absence of such means, resulting in the reconstituted fundamental frequency current being of greater magnitude and out of phase with the original fundamental frequency current to a greater degree, thereby requiring the oscillator output to deviate in frequency to a greater degree before obtaining stable operation. Since a change in the diode bias voltage, whether D.C. or A.C., causes a greater traverse of the diode positive and negative conductance regions and thereby generates a greater magnitude and phase angle of the harmonic frequency currents, it is evident that a change in bias voltage produces a greater deviation in the fundamental frequency of the oscillator output when utilizing my harmonic impedance means. Thus, my FIGURE 3 crystal controlled oscillator is more frequency sensitive to changes in bias voltage, and thus achieves an increased degree of frequency modulation by bias voltage control.

With a fixed D.C. bias and a particular A.C. modulating voltage the resulting frequency deviation (modulation) of my FIGURE 3 oscillator becomes more sensitive to the tuning of the harmonic circuits and maximum deviation occurs approximately at their resonance. As a particular example of the circuit of FIGURE 3, a tunnel diode 8 of the gallium arsenide type manufactured by the General Electric Company and having a 1 milliampere peak current rating and a piezioelectric crystal 30 having a series resonance at 18 mHz. (megahertz) were connected in an oscillator circuit having a fundamental frequency of 18 mHz. The bias network provided a D.C. voltage of 0.12 volt across the tunnel diode and the pi network of elements 31, 32, and 33 had values of approximately 25 picofarads, 3 microhenries, and 25 picofarads, respectively. The values of elements 36, 37, 38, and 39 in the two harmonic impedance networks had values of approximately 0.13 microhenry, 150 picofarads, 0.085 microhenry, and 100 picofarads, respectively. It was found that removal of the harmonic impedance networks from the circuit caused a reduction of the frequency deviation with bias voltage deviation by a factor of 3.

Figure 4:
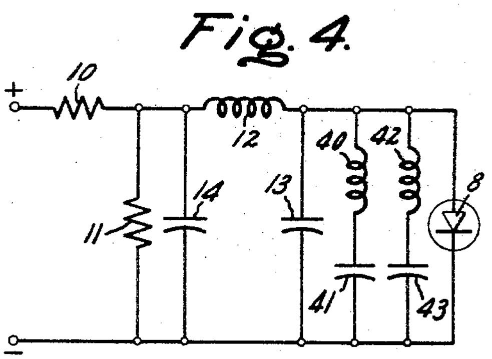
FIGURE 4 is a first embodiment of an L-C oscillator utilizing the negative resistance diode and harmonic impedance means in accordance with my invention.

An oscillator circuit is made more insensitive to bias voltage changes, that is, obtains a greater frequency stability by employing the harmonic impedance means illustrated in FIGURE 4. In this circuit, a negative resistance device oscillator of the L-C type shown in FIGURE 1 is additionally provided with one or more series resonant circuits tuned to successive low harmonics of the oscillator fundamental frequency and connected directly across the negative resistance device 8. Thus, a first series resonant circuit comprising inductor 40 and capacitor 41 is resonant at the second harmonic of the oscillator fundamental frequency and a second series resonant circuit comprising inductor 42 and capacitor 43 is resonant at the third harmonic. A necessary condition imposed on my FIGURE 4 harmonic means is that at the oscillator fundamental frequency the impedance of each series resonant circuit be greater than (and preferably much greater than) the impedance of capacitor 13 whereas at the harmonic frequencies the respective impedances are less than (and preferably both such impedances and the diode impedance are much less than) the impedance of such capacitor. The series resonant harmonic networks effectively provide a short circuit across the negative resistance device 8 for the harmonic frequency currents generated in diode 8 and thus provide lower impedances to such currents than that provided by capacitor 13. The effective short circuiting of the harmonic frequency currents reduces the magnitude of the harmonic frequency voltages developed across diode 8 resulting in the reconstituted fundamental frequency current being of smaller magnitude and less out of phase with the original fundamental frequency current than without the harmonic impedance means and thus reducing the frequency deviation of the fundamental oscillator frequency due to changes in bias voltage. A particular example of the FIGURE 4 embodiment is a circuit operating at a frequency of 18 mHz. and comprising an inductor 12 of 3 microhenries, capacitor 13 of 25 picofarads, inductor 40 of 0.13 microhenry, capacitor 41 of 150 picofarads, inductor 42 of 0.085 microhenry, and capacitor 43 of 100 picofarads. Diode device 8 is of the same type in this and all the following particular examples as in the case of the particular FIGURE 3 example. Bypass capacitor 14 had a value of 0.01 microfarad in these examples.

Figure 5:
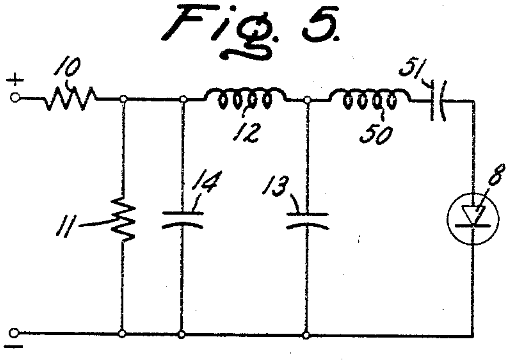
FIGURE 5 is a second embodiment of an L-C oscillator utilizing the negative resistance diode and an additional series resonant circuit tuned to the oscillator fundamental frequency in accordance with my invention.

FIGURE 5 illustrates a third embodiment of my invention and specifically illustrates a second embodiment of the L-C oscillator wherein a harmonic impedance means in the form of a series resonant circuit comprising inductor 50 and capacitor 51 is connected in series circuit relationship between the juncture of inductor 12 and capacitor 13 and the anode (or cathode) of negative resistance diode 8. In this FIGURE 5 embodiment, only one series resonant network is employed and it is series resonant at the fundamental (first harmonic) oscillator frequency to thereby provide a high impedance to harmonic frequency currents in a similar manner as the parallel resonant circuits provide such high impedance in the FIGURE 3 embodiment. Thus, the harmonic frequency currents generated in diode 8 produce harmonic frequency voltages across such diode of greater magnitude than in the absence of harmonic impedance means 50, 51 and thereby obtain a greater frequency deviation with change in bias voltage. As a specific example of this circuit, the fundamental frequency determining elements 12 and 13 have the same value in an oscillator operating at 18 mHz. as in the case of the FIGURE 4 embodiment. Inductor 50 has a value of 1 microhenry and capacitor 51 a value of 75 picofarads.

Figure 6:
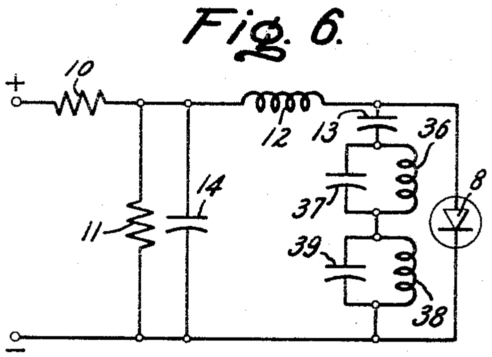
FIGURE 6 is a third embodiment of an L-C oscillator utilizing the negative resistance diode and the harmonic impedance means shown in FIGURE 3 in accordance with my invention.

The FIGURES 3, 4, and 5 embodiments illustrate three arrangements of resonant networks also described as harmonic impedance means when employed in conventional type negative resistance device oscillator circuits provide a means for modifying the fundamental frequency of the oscillator. To illustrate this point, the parallel resonant networks of the FIGURE 3 embodiment of a crystal controlled negative resistance diode oscillator may be added in series circuit relationship with capacitor 13 of the L-C negative resistance diode oscillator illustrated in FIGURE 1 to obtain the FIGURE 6 embodiment. For the same fundamental frequency of oscillation, the inductance and capacitance values of elements 36–39 may be, but are not necessarily, the same in the FIGURE 6 embodiment as in the FIGURE 3 embodiment to obtain a circuit wherein the oscillator fundamental frequency becomes more sensitive to bias voltage changes, that is, obtains a greater frequency deviation than in the case without such additional parallel resonant circuits.

Figure 7:
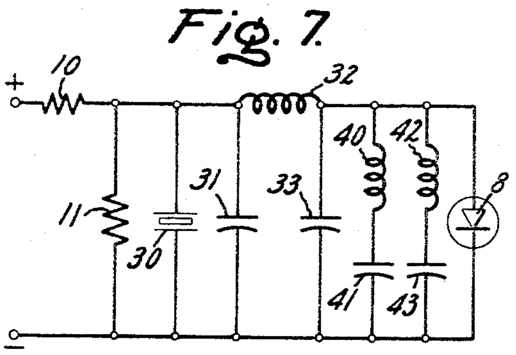
FIGURE 7 is a second embodiment of a crystal controlled oscillator utilizing the negative resistance diode and the harmonic impedance means shown in FIGURE 4 in accordance with my invetnion.

As another example, the series resonant circuits tuned to successive low harmonics of the oscillator fundamental frequency of an L-C negative resistance diode oscillator illustrated in the FIGURE 4 embodiment may also be employed in a crystal controlled negative resistance diode oscillator as illustrated in FIGURE 7 to obtain an oscillator circuit which also has a greater frequency stability in that the fundamental frequency deviation with bias voltage change is reduced. The inductance and capacitance values of the series resonant elements 40–43 may also be the same as the values of the similar elements in the FIGURE 4 embodiment for oscillators having identical fundamental frequencies.

Figure 8:
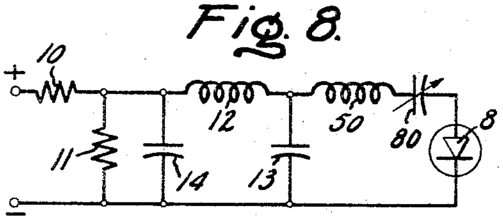
FIGURE 8 is a schematic diagram of a negative resistance diode oscillator utilizing adjustable harmonic impedance means in accordance with my invention.

FIGURE 1 specifically illustrates one means for obtaining frequency modulation, that is, by superimposing an A.C. voltage on the D.C. bias voltage. Another means for obtaining frequency modulation in accordance with my invention is by an adjustable control or modulation of the harmonic impedance means. A convenient means for achieving this latter function is illustrated in the FIGURE 8 embodiment of an L-C negative resistance diode oscillator wherein the capacitance and thus the capacitive reactance of capacitor 80 is controllable. The FIGURE 8 means for obtaining frequency modulation is employed in cases wherein the bias voltage is not variable or includes no A.C. voltage source. Inductor 50 and variable capacitor 80 are tuned to the oscillator fundamental frequency as in the FIGURE 5 embodiment. Variation of the capacitance of capacitor 80 varies (modulates) the impedance across diode 8, thereby modulating the harmonic frequency voltages produced across the diode resulting in increased deviation or modulation of the oscillator fundamental frequency. This variable harmonic impedance means technique for increasing the frequency deviation of an active negative resistance device oscillator is obviously also applicable in the FIGURE 3 and FIGURE 6 embodiments for increasing frequency deviation or modulation and further, it should be obvious that the variable impedance element can also be the inductor element or elements.

From the foregoing description, it can be appreciated that my invention attains the objectives set forth and makes available an improved negative resistance diode oscillator having harmonic impedance means for modifying the fundamental frequency of the oscillator in that the fundamental frequency deviation may be increased or decreased with changes in bias voltage or other means tending to change such frequency. It is obvious that modification and variation of my invention is possible in the light of the above teachings. Thus, other types of oscillator circuits employing active negative resistance devices may also be utilized with my harmonic impedance means for obtaining a desired modification of the oscillator frequency output. It is, therefore, to be understood that changes may be made in the particular embodiments as described which are within the full intended scope of the invention as defined by the following claims.

What I claim as new and desire to secure by Letters Patent of the United States is:

1. An active negative resistance device oscillator circuit comprising
   a voltage controlled active negative resistance device,
   means for voltage biasing said negative resistance device in the negative resistance region,
   a first resonant network interconnected between said negative resistance device and said biasing means, said first resonant network primarily determining the fundamental frequency of the oscillator, and
   a serially connected inductor and capacitor connected in series circuit relationship between a first terminal of said negative resistance device and said first resonant network, said serially connected inductor and capacitor being series resonant at the oscillator fundamental frequency to thereby increase the fundamental frequency deviation of the oscillator with changes in the bias voltage of said negative resistance device.

2. An active negative resistance device oscillator circuit comprising
   a voltage controlled active negative resistance device,
   means for voltage biasing said negative resistance device in the negative resistance region,
   a first resonant network interconnected between said negative resistance device and said biasing means, said first resonant network primarily determining the fundamental frequency of the oscillator, and
   at least one serially connected inductor and capacitor connected directly across said negative resistance device, said serially connected inductors and capacitors being series resonant at successive low harmonics of the oscillator fundamental frequency to thereby decrease the fundamental frequency deviation of the oscillator with changes in the bias voltage of said negative resistance device and thereby obtain a more stable oscillator.

3. An active negative resistance device oscillator circuit comprising
   a voltage controlled active negative resistance device,
   means for voltage biasing said negative resistance device in the negative resistance region,
   a first resonant network interconnected between said negative resistance device and said biasing means, said first resonant network primarily determining the fundamental frequency of the oscillator, and
   a plurality of parallel resonant circuits, each of said parallel resonant circuits comprising an inductor and a capacitor connected in parallel circuit relationship, said parallel resonant circuits connected in series circuit relationship across said negative resistance device and being parallel resonant at successive low harmonics of the oscillator fundamental frequency to thereby increase the fundamental frequency deviation of the oscillator with changes in the bias voltage of said negative resistance device.

4. An active negative resistance device oscillator circuit comprising a voltage controlled active negative resistance device,
   means for voltage biasing said negative resistance device in the negative resistance region,
   a first resonant network interconnected between said negative resistance device and said biasing means, said first resonant network primarily determining the fundamental frequency of the oscillator, and
   a plurality of series resonant circuits, each of said series resonant circuits comprising an inductor and a capacitor connected in series circuit relationship, said series resonant circuits each connected directly across said negative resistance device and being series resonant at successive low harmonics of the oscillator fundamental frequency to thereby decrease the fundamental frequency deviation of the oscillator with changes in the bias voltage of said negative resistance device and thereby obtain a more stable oscillator.

5. An active negative resistance device oscillator circuit comprising
   a voltage controlled active negative resistance device,
   means for voltage biasing said negative resistance device in the negative resistance region,
   a first resonant network interconnected between said negative resistance device and said biasing means, said first resonant network primarily determining the fundamental frequency of the oscillator and comprising a piezoelectric crystal having a series resonance mode at the oscillator fundamental frequency,
   at least a second resonant network interconnected between said first resonant network and said negative resistance device, said second resonant network tuned to a particular harmonic frequency of the oscillator fundamental frequency for modifying the fundamental frequency output of said oscillator, and
   impedance transforming means interconnected between said piezoelectric crystal and said second resonant network for matching the low impedance of said crystal to the high impedance of said negative resistance device.

6. The active negative resistance device oscillator set forth in claim 5 wherein
   said impedance transforming means comprises
      a first capacitor connected directly across said crystal,
      a first inductor interconnected between a first juncture of said crystal and said first capacitor and a first terminal of said negative resistance device, and
      a second capacitor interconnected between the juncture of said first inductor and said first terminal of said negative resistance device and said at least a second resonant network, a second terminal of said negative resistance device connected to a second juncture of said crystal and said first capacitor,
   said at least a second resonant network comprising a pair of parallel resonant circuits,
      a first of said pair of parallel resonant circuits comprising a second inductor and a third capacitor connected in parallel circuit relationship and being parallel resonant at the second harmonic of the oscillator fundamental frequency, and
      a second of said pair of parallel resonant circuits comprising a third inductor and a fourth capacitor connected in parallel circuit relationship and being parallel resonant at the third harmonic of the oscillator fundamental frequency, said first and second parallel resonant circuits connected in series circuit relationship with said second capacitor directly across said negative resistant device to thereby increase the fundamental frequency deviation of the oscillator with changes in the bias voltage of said negative resistance device.

7. The active negative resistance device oscillator circuit set forth in claim 5 wherein said impedance transforming means comprises a first capacitor connected directly across said crystal, a first inductor interconnected between a first juncture of said crystal and said first capacitor and a first terminal of said negative resistance device, and a second capacitor connected directly across said negative resistance device, a second terminal of said negative resistance device connected to a second juncture of said crystal and said first capacitor, said at least a second resonant network comprising a pair of series resonant circuits a first of said pair of series resonant circuits comprising a second inductor and a third capacitor connected in series circuit relationship directly across said negative resistance device and being series resonant at the second harmonic of the oscillator fundamental frequency, and a second of said pair of series resonant circuits comprising a third inductor and a fourth capacitor connected in series circuit relationship directly across said negative resistance device and being series resonant at the third harmonic of the oscillator fundamental frequency to thereby decrease the fundamental frequency deviation of the oscillator with changes in the bias voltage of said negative resistance device and thereby obtain a more stable oscillator.

8. An active negative resistance device oscillator circuit comprising a voltage controlled active negative resistance device, means for voltage biasing said negative resistance device in the negative resistance region, a first resonant network interconnected between said negative resistance device and said biasing means, said first resonant network primarily determining the fundamental frequency of the oscillator and comprising a first inductor having a first end thereof connected to a first terminal of said voltage biasing means, and a first capacitor having a first end thereof connected to the second end of said first inductor, a second capacitor connected across the first and second terminals of said voltage biasing means for providing a low alternating current impedance path shunting said voltage biasing means, a first terminal of said negative resistance device connected to said second terminal of said voltage biasing means, and at least a second resonant network interconnected between said first resonant network and said negative resistace device, said second resonant network tuned to a particular harmonic frequency of the oscillator fundamental frequency for modifying the fundamental frequency output of said oscillator.

9. The active negative resistance device oscillator circuit set forth in claim 8 wherein said first capacitor is connected directly across said negative resistance device, and said at least a second resonant network comprising a pair of series resonant circuits, a first of said pair of series resonant circuits comprising a second inductor and a third capacitor connected directly across said negative resistance device and being series resonant at the second harmonic of the oscillator fundamental frequency, a second of said pair of series resonant circuits comprising a third inductor and a fourth capacitor connected in series circuit relationship directly across said negative resistance device and being series resonant at the third harmonic of the oscillator fundamental frequency to thereby decrease the fundamental frequency deviation of the oscillator with changes in the bias voltage of said negative resistance device and thereby obtain a more stable oscillator.

10. The active negative resistance device oscillator circuit set forth in claim 8 wherein said first capacitor having a second end thereof connected to said second terminal of said voltage biasing means, and said at least a second resonant network comprising a series resonant circuit comprising a second inductor and a third capacitor connected in series circuit relationship between said second end of said first inductor and a terminal of said negative resistance device and being series resonant at the fundamental frequency of the oscillator to thereby increase the fundamental frequency deviation of the oscillator with changes in the bias voltage of said negative resistance device.

11. The active negative resistance device oscillator circuit set forth in claim 8 wherein said second end of said first inductor is connected to a second terminal of said negative resistance device, and said at least a second resonant network comprising a pair of parallel resonant circuits, a first of said pair of parallel resonant circuits comprising a second inductor and a third capacitor connected in parallel circuit relationship and being parallel resonant at the second harmonic of the oscillator fundamental frequency, a second of said pair of parallel resonant circuits comprising a third inductor and a fourth capacitor connected in parallel circuit relationship and being parallel resonant at the third harmonic of the oscillator fundamental frequency, said first and second parallel resonant circuits connected in series circuit relationship with said first capacitor directly across said negative resistance device to thereby increase the fundamental frequency deviation of the oscillator with changes in the bias voltage of said negative resistance device.

12. An active negative resistance device oscillator circuit comprising a voltage controlled active negative resistance device, means for voltage biasing said negative resistance device in the negative resistance region, a first resonant network interconnected between said negative resistance device and said biasing means, said first resonant network primarily determining the fundamental frequency of the oscillator, and a second resonant network comprising a serially connected first inductor and first capacitor connected in series circuit relationship between a terminal of said negative resistance device and said first resonant network, said first capacitor of the variable capacitance type being controllably variable in its value of impedance to harmonic frequency currents generated by the nonlinear characteristics of said negative resistance device, said second resonant network being series resonant at the oscillator fundamental frequency for a particular value capacitance of said first capacitor to thereby increase the fundamental frequency deviation of the oscillator with variation in the capacitance of said first capacitor in the absence of changes in the bias voltage of said negative resistance device.

13. The active negative resistance device oscillator circuit set forth in claim 12 wherein said first resonant network comprises a second inductor having a first end thereof connected to a first terminal of said voltage biasing means, a second capacitor having a first end thereof connected to the second end of said second inductor, and a second end thereof connected to a juncture of a first terminal of said negative resistance and said second terminal of said voltage biasing means, a third capacitor connected across the first and second terminals of said voltage biasing means for providing a low alternating current impedance path shunting said voltage biasing means, and said serially connected first inductor and first capacitor connected in series circuit relationship between the juncture of said first end of said second capacitor and said second end of said second inductor and a terminal of said negative resistance device.

References Cited

UNITED STATES PATENTS

| | | | |
|---|---|---|---|
| 2,824,964 | 2/1958 | Yin | 331—115 |
| 3,041,552 | 6/1962 | Adamthwaite et al. | 331—115 X |
| 3,081,436 | 3/1963 | Watters. | |

OTHER REFERENCES

Nagle, Crystal-Stabilized Tunnel-Diode Oscillators, Electronics, Sept. 1, 1961, pp. 40–42.

JOHN KOMINSKI, *Primary Examiner.*

SIEGFRIED H. GRIMM, *Assistant Examiner.*

U.S. Cl. X.R.

307—322; 331—76, 115, 132, 158, 167, 175; 332—29; 333—80